(12) United States Patent
Chiang et al.

(10) Patent No.: US 10,199,277 B2
(45) Date of Patent: Feb. 5, 2019

(54) SEMICONDUCTOR PROCESS

(71) Applicant: UNITED MICROELECTRONICS CORP., Hsin-Chu (TW)

(72) Inventors: Chen-Kuo Chiang, Tainan (TW); Chun-Hsien Lin, Tainan (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 15/268,630

(22) Filed: Sep. 18, 2016

(65) Prior Publication Data
US 2017/0005007 A1 Jan. 5, 2017

Related U.S. Application Data

(62) Division of application No. 13/474,730, filed on May 18, 2012, now Pat. No. 9,478,627.

(51) Int. Cl.
*H01L 21/8232* (2006.01)
*H01L 21/8234* (2006.01)
(Continued)

(52) U.S. Cl.
CPC .. *H01L 21/823462* (2013.01); *H01L 21/0228* (2013.01); *H01L 21/02181* (2013.01);
(Continued)

(58) Field of Classification Search
CPC .......... H01L 21/823462; H01L 29/517; H01L 29/513; H01L 29/42364; H01L 21/0228;
(Continued)

(56) References Cited

U.S. PATENT DOCUMENTS 5,498,768 A 3/1996 Nishitani
6,063,698 A 5/2000 Tseng
(Continued)

FOREIGN PATENT DOCUMENTS

CN 101179028 A 5/2008

OTHER PUBLICATIONS

[Dina H. Triyoso], [Improved Electrical Properties of ALD HfxZr1-xO2 Dielectrics Deposited on Ultrathin PVD Zr Underlayer], [Jan. 2008], [pp. 57-59], [vol. 29], [IEEE Electron Device Letters].
(Continued)

*Primary Examiner* — Asok K Sarkar
*Assistant Examiner* — Dmitriy Yemelyanov
(74) *Attorney, Agent, or Firm* — Winston Hsu

(57) ABSTRACT

A semiconductor structure includes a stacked metal oxide layer on a substrate, wherein the stacked metal oxide layer includes a first metal oxide layer, a second metal oxide layer, and a third metal oxide layer from top to bottom, and the energy bandgap of the second metal oxide layer is lower than the energy bandgap of the first metal oxide layer and that of the third metal oxide layer. The semiconductor structure includes a metal oxide layer on a substrate, wherein the energy bandgap of the metal oxide layer changes along a direction perpendicular to the surface of the substrate. The present invention also provides a semiconductor process forming said semiconductor structure.

7 Claims, 7 Drawing Sheets

(51) Int. Cl.

| | | |
|---|---|---|
| *H01L 29/49* | (2006.01) | |
| *H01L 29/66* | (2006.01) | |
| *H01L 29/78* | (2006.01) | |
| *H01L 21/02* | (2006.01) | |
| *H01L 29/423* | (2006.01) | |
| *H01L 29/51* | (2006.01) | |
| H01L 27/092 | (2006.01) | |

(52) U.S. Cl.
CPC .. *H01L 21/02189* (2013.01); *H01L 21/02194* (2013.01); *H01L 21/02205* (2013.01); *H01L 29/42364* (2013.01); *H01L 29/4966* (2013.01); *H01L 29/513* (2013.01); *H01L 29/517* (2013.01); *H01L 29/66545* (2013.01); *H01L 29/78* (2013.01); H01L 27/092 (2013.01)

(58) Field of Classification Search
CPC ......... H01L 21/02205; H01L 21/02194; H01L 21/02181; H01L 21/02189; H01L 27/092
See application file for complete search history.

(56) References Cited

U.S. PATENT DOCUMENTS

| | | | |
|---|---|---|---|
| 6,251,761 B1 | 6/2001 | Rodder | |
| 6,380,104 B1 | 4/2002 | Yu | |
| 6,407,435 B1* | 6/2002 | Ma | H01L 21/28185 257/406 |
| 6,492,217 B1 | 12/2002 | Bai | |
| 6,642,066 B1 | 11/2003 | Halliyal | |
| 6,656,852 B2 | 12/2003 | Rotondaro | |
| 6,696,345 B2 | 2/2004 | Chau | |
| 6,818,517 B1 | 11/2004 | Maes | |
| 6,818,553 B1 | 11/2004 | Yu | |
| 6,841,484 B2 | 1/2005 | Ying | |
| 6,921,702 B2* | 7/2005 | Ahn | C23C 16/405 257/E21.274 |
| 6,921,711 B2 | 7/2005 | Cabral, Jr. | |
| 7,012,027 B2 | 3/2006 | Perng | |
| 7,030,430 B2 | 4/2006 | Doczy | |
| 7,126,199 B2 | 10/2006 | Doczy | |
| 7,135,361 B2 | 11/2006 | Visokay | |
| 7,157,378 B2 | 1/2007 | Brask | |
| 7,160,767 B2 | 1/2007 | Brask | |
| 7,208,366 B2 | 4/2007 | Tsai | |
| 7,371,649 B2 | 5/2008 | Cheng | |
| 7,381,608 B2 | 6/2008 | Brask | |
| 7,384,880 B2 | 6/2008 | Brask | |
| 7,488,656 B2 | 2/2009 | Cartier | |
| 7,501,336 B2 | 3/2009 | Doyle | |
| 7,521,324 B2 | 4/2009 | Ohmi | |
| 7,601,648 B2 | 10/2009 | Chua | |
| 7,824,990 B2 | 11/2010 | Chang | |
| 8,324,118 B2 | 12/2012 | Liu | |
| 2002/0130340 A1 | 9/2002 | Ma | |
| 2004/0007561 A1 | 1/2004 | Nallan | |
| 2005/0202624 A1 | 9/2005 | Li | |
| 2005/0275035 A1 | 12/2005 | Mathew | |
| 2006/0054937 A1 | 3/2006 | Lucovsky | |
| 2006/0054943 A1 | 3/2006 | Li | |
| 2006/0094192 A1 | 5/2006 | Yang | |
| 2006/0172548 A1 | 8/2006 | Wu | |
| 2006/0197227 A1* | 9/2006 | Liang | H01L 21/28194 257/761 |
| 2006/0211259 A1 | 9/2006 | Maes | |
| 2006/0284271 A1 | 12/2006 | Doyle | |
| 2008/0070395 A1 | 3/2008 | Yen | |
| 2008/0157231 A1 | 7/2008 | Wang | |
| 2008/0233288 A1* | 9/2008 | Clark | C23C 16/308 427/255.394 |
| 2009/0057787 A1 | 3/2009 | Matsuki | |
| 2009/0085175 A1 | 4/2009 | Clark | |
| 2009/0179283 A1 | 7/2009 | Adams | |
| 2010/0062592 A1 | 3/2010 | Clark | |
| 2010/0068877 A1 | 3/2010 | Yeh | |
| 2010/0075507 A1 | 3/2010 | Chang | |
| 2010/0081262 A1 | 4/2010 | Lim | |
| 2010/0184281 A1 | 7/2010 | Hsu | |
| 2010/0219481 A1 | 9/2010 | Tseng | |

OTHER PUBLICATIONS

Liu et al., Title of Invention: Manufacturing Method of Metal Gate Structure, U.S. Appl. No. 13/072,795, filed Mar. 28, 2011.

[R. I. Hegde], [Microstructure Modified HfO2 Using Zr Addition with TaxCy Gate for Improved Device Performance and Reliability], [Dec. 2005].

Annelies Delabie, Atomic layer deposition of hafnium oxide on germanium substrates, Mar. 2005, 10 page(s), 064104, Journal of Applied Physics 97.

Chen-Kuo Chiang et al., "ZrO2 position in ALD HfZrO2 for MOSCAP Device Leakage Current Reduction and MOSFET Reliability Improvement", Invention Disclosure, Sep. 23, 2010, p. 1-16.

* cited by examiner

SEMICONDUCTOR PROCESS

CROSS REFERENCE TO RELATED APPLICATIONS

This application is a divisional application of and claims the benefit of U.S. patent application Ser. No. 13/474,730, filed May 18, 2012.

BACKGROUND OF THE INVENTION

1. Field of the Invention

The present invention relates generally to a semiconductor structure and a process thereof, and more specifically to a semiconductor structure and a process thereof, that forms a metal oxide layer having a changing energy bandgap along a direction perpendicular to the surface of a substrate.

2. Description of the Prior Art

Poly-silicon is conventionally used as a gate electrode in semiconductor devices, such as metal-oxide-semiconductors (MOS). But with the trend towards scaling down the size of semiconductor devices, conventional poly-silicon gates face problems such as lower performances due to boron penetration and unavoidable depletion effect. This increases the equivalent thickness of the gate dielectric layer, reduces the gate capacitance, and worsens the driving force of the devices. Therefore, work function metals that are suitable to be used as high-K gate dielectric layers are employed to replace the conventional poly-silicon gate to be the control electrode. The high-K gate dielectric layer is formed by a single material, so that the high-K gate dielectric layer has only a single dielectric constant, meaning a single energy bandgap.

SUMMARY OF THE INVENTION

The present invention provides a semiconductor structure and a process thereof, that forms a metal oxide layer having a changing energy bandgap along a direction perpendicular to the surface of a substrate, and the distribution of the energy bandgap of the metal oxide layer can be adjusted by processes.

The present invention provides a semiconductor structure including a stacked metal oxide layer on a substrate, wherein the stacked metal oxide layer includes a first metal oxide layer, a second metal oxide layer, and a third metal oxide layer from top to bottom, and the energy bandgap of the second metal oxide layer is lower than the energy bandgap of the first metal oxide layer and that of the third metal oxide layer.

The present invention provides a semiconductor structure including a metal oxide layer on a substrate, wherein the energy bandgap of the metal oxide layer changes along a direction perpendicular to the surface of the substrate.

The present invention provides a semiconductor process including the following steps. An atomic layer deposition (ALD) process is performed, that sequentially imports different precursors to form a first metal oxide layer, a second metal oxide layer and a third metal oxide layer on a substrate, thereby forming a stacked metal oxide layer, wherein the energy bandgap of the second metal oxide layer is lower than the energy bandgap of the first metal oxide layer and the third metal oxide layer.

The present invention provides a semiconductor process including the following steps. An atomic layer deposition (ALD) process is performed, that imports two or more than two precursors simultaneously to form a metal oxide layer on a substrate, wherein the energy bandgap of the metal oxide layer changes along a direction perpendicular to the surface of the substrate.

According to the above, the present invention provides a semiconductor structure and a process thereof that forms a metal oxide layer having an energy bandgap changing along a direction perpendicular to the surface of a substrate. More precisely, the metal oxide layer may be a stacked metal oxide layer, formed by an atomic layer deposition (ALD) process that sequentially imports different precursors. The stacked metal oxide layer includes a first metal oxide layer, a second metal oxide layer and a third metal oxide layer from top to bottom, wherein the energy bandgap of the second metal oxide layer is lower than the energy bandgap of the first metal oxide layer and that of the third metal oxide layer. The metal oxide layer may be a metal oxide layer, formed through an atomic layer deposition (ALD) process, importing two or more than two precursors simultaneously, wherein the energy bandgap of the metal oxide layer changes along a direction perpendicular to the surface of the substrate. This way, the reliability can be improved, considering for example the time dependent dielectric breakdown (TDDB) of a semiconductor component formed by the metal oxide layer, and circuit leakage can be prevented.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
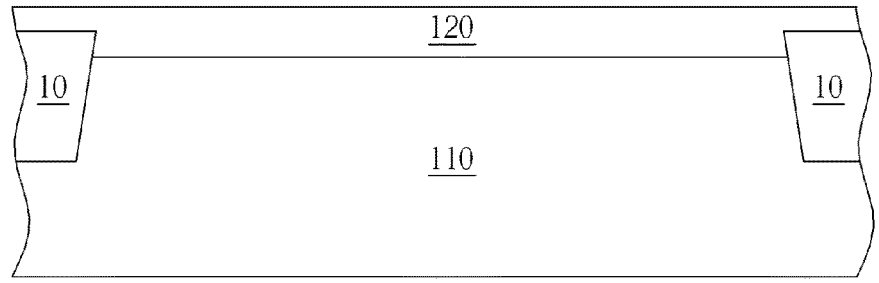
FIGS. 1-6 schematically depict cross-sectional views of a semiconductor process according to a first embodiment of the present invention.

The semiconductor process of the present invention can include gate-first processes, gate-last for high-K first processes or gate-last for high-K last processes or etc. In the following two embodiments, a first embodiment is carried out with a gate-last for high-K first process, and a second embodiment is carried out with a gate-last for high-K last process. However, the two embodiments are only two cases of the present invention application, which means that the first embodiment can also be carried out with a gate-last for high-K last process, and the second embodiment can also be carried out with a gate-last for high-K first process, or the two embodiments can be carried out with other semiconductor processes. Planar MOS transistors are just examples in the following embodiments, but the present invention can also be applied to tri-gate MOSFETs, such as fin-shaped field effect transistors (FinFET), but not limited to FIGS. 1-6 schematically depict cross-sectional views of a semiconductor process according to a first embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. An isolation structure 10 may be formed in the substrate 110 to isolate each transistor. The isolation structure 10 may be a shallow trench isolation (STI) structure, formed by a shallow trench isolation (STI) process, but it is not limited thereto. A buffer layer 120 may be selectively formed to cover the substrate 110. The buffer layer may be an oxide layer, formed by a thermal oxide process, a chemical oxide process, etc.

Figure 2:
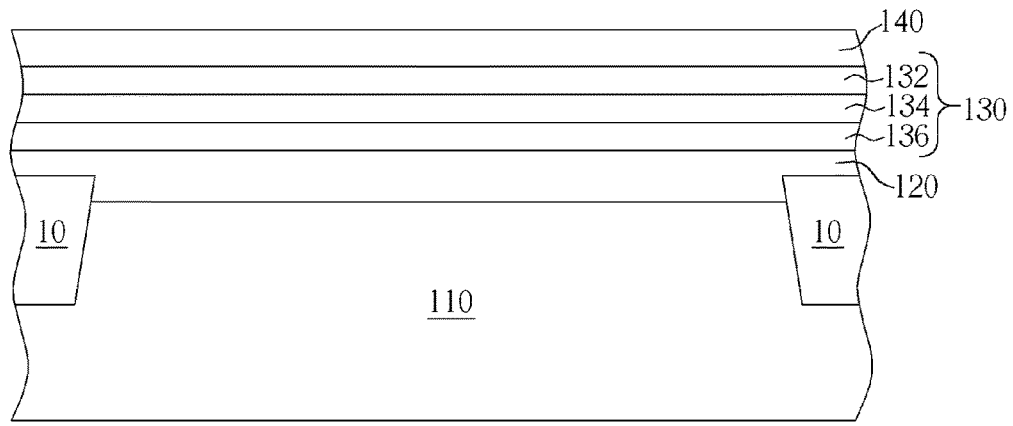

As shown in FIG. 2, a stacked metal oxide layer 130 is formed on the buffer layer 120. A barrier layer 140 may be selectively formed on the stacked metal oxide layer 130. In this embodiment, the stacked metal oxide layer 130 is formed through an atomic layer deposition (ALD) process. More precisely, the stacked metal oxide layer 130 may include a first metal oxide layer 132, a second metal oxide layer 134 and a third metal oxide layer 136 on the substrate 110, and three of them are formed by sequentially importing different precursors during the atomic layer deposition (ALD) process, wherein the energy bandgap of the second metal oxide layer 134 is lower than the energy bandgap of the first metal oxide layer 132 and that of the third metal oxide layer 136. In one case, precursors of Hafnium Tetrachloride (HfCl4) and water (H2O) maybe imported to form a Hafnium oxide layer, precursors of Zirconium Tetrachloride (ZrCl4) and water (H2O) may be imported to form a Zirconium oxide layer, and then precursors of Hafnium Tetrachloride (HfCl4) and water (H2O) maybe imported to form a Hafnium oxide layer, so that the stacked metal oxide layer 130 is formed, but it is not limited thereto. By doing this, the time dependent dielectric breakdown (TDDB) for example can be improved, leading to the improvement of the reliability of semiconductor components such as transistors formed by the present invention. The equivalent oxide thickness (EOT) of the semiconductor components can also be reduced, due to the second metal oxide layer 134 being formed between the first metal oxide layer 132 and the third metal oxide layer 136; and the energy bandgap of the second metal oxide layer 134 is lower than the energy bandgap of the first metal oxide layer 132 and that of the third metal oxide layer 136. Furthermore, due to the second metal oxide layer 134 having lower energy bandgap than the first metal oxide layer 132 and that of the third metal oxide layer 136 being formed between them, the materials having lower energy bandgaps do not contact the substrate 110 or the buffer layer 120, or the metal materials such as the barrier layer 140 above the stacked metal oxide layer 130, so that circuit leakage can be avoided.

Figure 12:
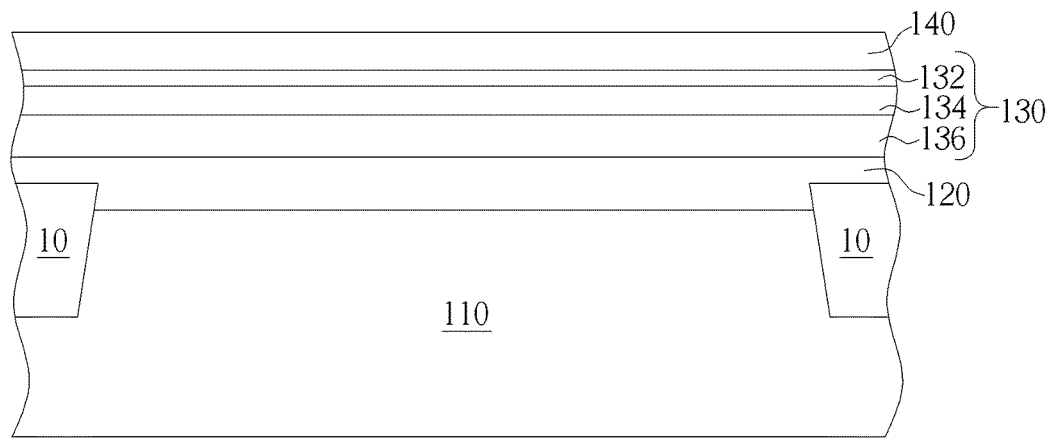
FIG. 12 schematically depicts a cross-sectional view of a semiconductor process according to another embodiment of the present invention.
Figure 13:
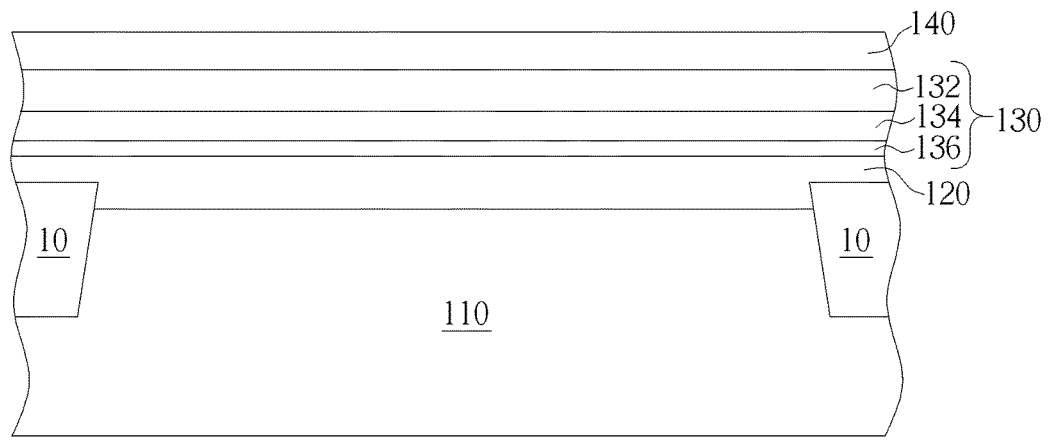
FIG. 13 schematically depicts a cross-sectional view of a semiconductor process according to another embodiment of the present invention.

The first metal oxide layer 132 and the third metal oxide layer 136 may have the same thicknesses to prevent the second metal oxide layer 134 from being too close to the substrate 110, the buffer layer 120 or the barrier layer 140, which would lead to circuit leakage. As the stacked metal oxide layer 130 of the present invention is used to form a gate dielectric layer of an NMOS transistor, the thickness of the first metal oxide layer 132 is preferred to be designed thinner than the thickness of the third metal oxide layer 136 as shown in FIG.12, so that the second metal oxide layer 134 is away from the substrate 110, in order to prevent electrons from being trapped in the second metal oxide layer 134 because of the band gap of the second metal oxide layer 134 being inferior to that of the first metal oxide layer 132 and that of the third metal oxide layer 136 since the second metal oxide layer 134 has a larger dielectric constant than the one of the first metal oxide layer 132 and the one of third metal oxide layer 136, and being closer to the substrate 110, which would lead to circuit leakage into the substrate 110. In contrast, as the stacked metal oxide layer 130 of the present invention is used to form a gate dielectric layer of a PMOS transistor, the thickness of the first metal oxide layer 132 is preferred to be designed larger than the thickness of the third metal oxide layer 136 as shown in FIG.13, so that the second metal oxide layer 134 is away from metal materials such as the above barrier layer 140, in order to prevent electrical holes from being trapped in the second metal oxide layer 134 because of the band gap of the second metal oxide layer 134 being inferior to the one of the first metal oxide layer 132 and the one of the third metal oxide layer 136 since the second metal oxide layer 134 has a larger dielectric constant than the one of the first metal oxide layer 132 and the one of the third metal oxide layer 136, and being closer to the metal materials such as the barrier layer 140, which would lead to circuit leakage into the metal materials such as the barrier layer 140. In other words, for a CMOS transistor, the second metal oxide layer 134 located in a NMOS transistor is preferred to be away from the substrate 110 than the second metal oxide layer 134 located in a PMOS transistor. That is, the thickness of the third metal oxide layer 136 located in the NMOS transistor is preferred to be thicker than the thickness of the third metal oxide layer 136 located in the PMOS transistor.

In this embodiment, the first metal oxide layer 132 and the third metal oxide layer 136 include the same materials, but it is not limited thereto. For example, the second metal oxide layer 134 may be a zirconium oxide layer, and the first metal oxide layer 132 and the third metal oxide layer 136 may be hafnium oxide layers, but it is not limited thereto. The first metal oxide layer 132, the second metal oxide layer 134 and the third metal oxide layer 136 may be groups selected from hafnium oxide (HfO2), hafnium silicon oxide (HfSiO4), hafnium silicon oxynitride (HfSiON), aluminum oxide (Al2O3), lanthanum oxide (La2O3), tantalum oxide (Ta2O5), yttrium oxide (Y2O3), zirconium oxide (ZrO2), strontium titanate oxide (SrTiO3), zirconium silicon oxide (ZrSiO4), hafnium zirconium oxide (HfZrO4), strontium bismuth tantalite (SrBi2Ta2O9, SBT), lead zirconate titanate (PbZrxTi1-xO3, PZT) and barium strontium titanate (BaxSr1-xTiO3, BST). For instance, the dielectric constant of lanthanum oxide ($La_2O_3$) or titanium oxide ($TiO_2$) is larger than the dielectric constant of hafnium oxide, meaning the energy bandgap of lanthanum oxide ($La_2O_3$) or titanium oxide ($TiO_2$) being larger than the energy bandgap of hafnium oxide, and they can therefore be used to replace zirconium oxide. The barrier layer 140 may include titanium, titanium nitride, tantalum, tantalum nitride or etc, to prevent metal atoms from diffusing.

The energy bandgaps of the first metal oxide layer 132, the second metal oxide layer 134 and the third metal oxide layer 136 will change after a thermal annealing process is performed. The changing variations of the energy bandgaps of the first metal oxide layer 132, the second metal oxide layer 134 and the third metal oxide layer 136 depend upon the material properties of the materials of the first metal oxide layer 132, the second metal oxide layer 134 and the third metal oxide layer 136. For example, the energy bandgaps of a hafnium oxide layer and a zirconium oxide layer will change after a thermal annealing process is performed, and the changing variation of the energy bandgap of the zirconium oxide layer is larger than the changing variation of the energy bandgap of the hafnium oxide layer. Therefore, the energy bandgaps of the first metal oxide layer 132, the second metal oxide layer 134 and the third metal oxide layer 136 can be adjusted by performing thermal annealing processes, so that the energy bandgaps of metal oxide layers described in the present invention represent the energy bandgaps of the metal oxide layers after thermal annealing processes are performed.

Figure 3:
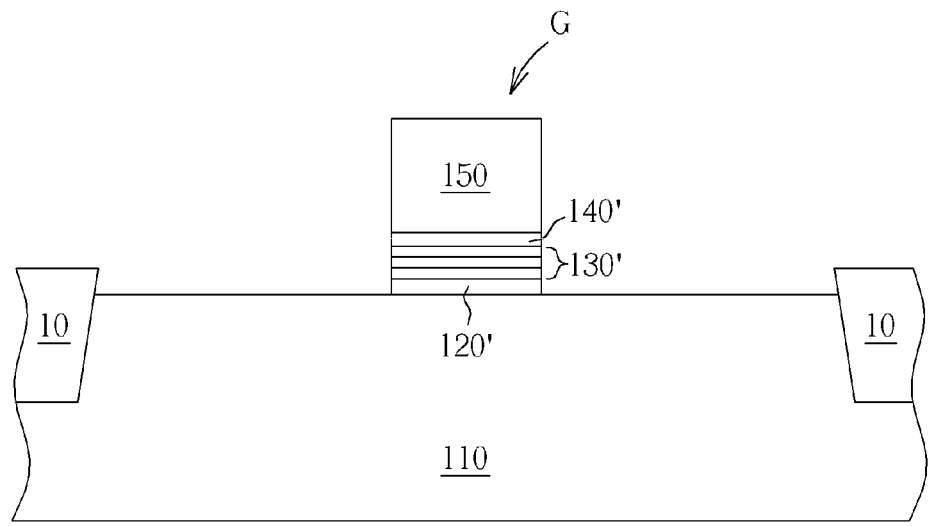

As shown in FIG. 3, a sacrificial electrode layer (not shown) is formed on the barrier layer 140. The sacrificial electrode layer (not shown), the barrier layer 140, the stacked metal oxide layer 130 and the buffer layer 120 are sequentially patterned to form a patterned buffer layer 120', a patterned stacked metal oxide layer 130', a patterned barrier layer 140' and a patterned sacrificial electrode layer 150, forming together a gate structure G.

Figure 4:
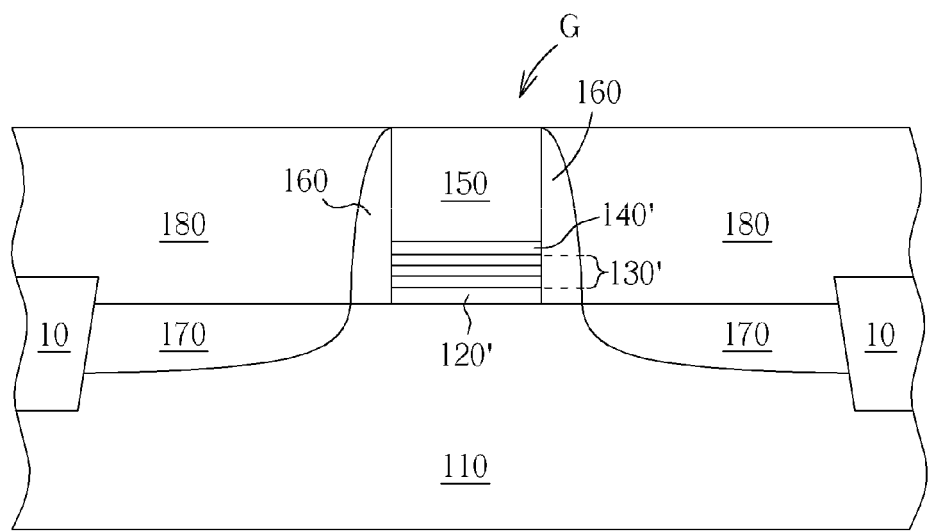

As shown in FIG. 4, a spacer 160 is formed on the substrate 110 beside the gate structure G to form a source/drain region 170 automatically aligned and formed through an ion implantation process. Before the spacer 160 is formed, a pre-spacer (not shown) may be selectively formed on the substrate 110 beside the gate structure G to form a lightly doped source/drain region (not shown) aligned and formed through a lightly doped ion implantation process. An interdielectric layer (not shown) is formed to cover the gate structure G, the spacer 160 and the substrate 110, and then the interdielectric layer (not shown) is planarized to form an interdielectric layer 180. The spacer 160 may be a single layer or a multilayer structure composed of materials such as silicon nitride or silicon oxide etc. The interdielectric layer 180 may be composed of oxide, but it is not limited thereto.

Figure 5:
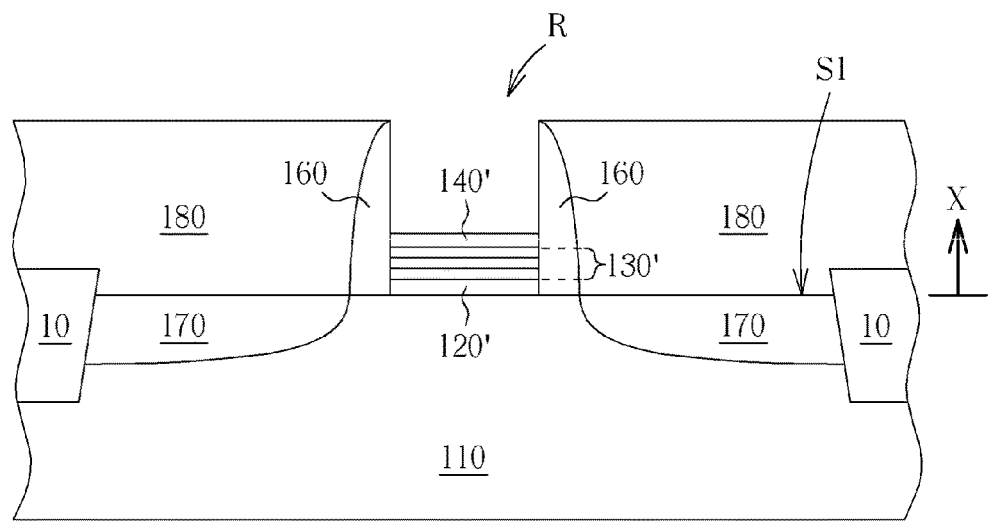
Figure 6:
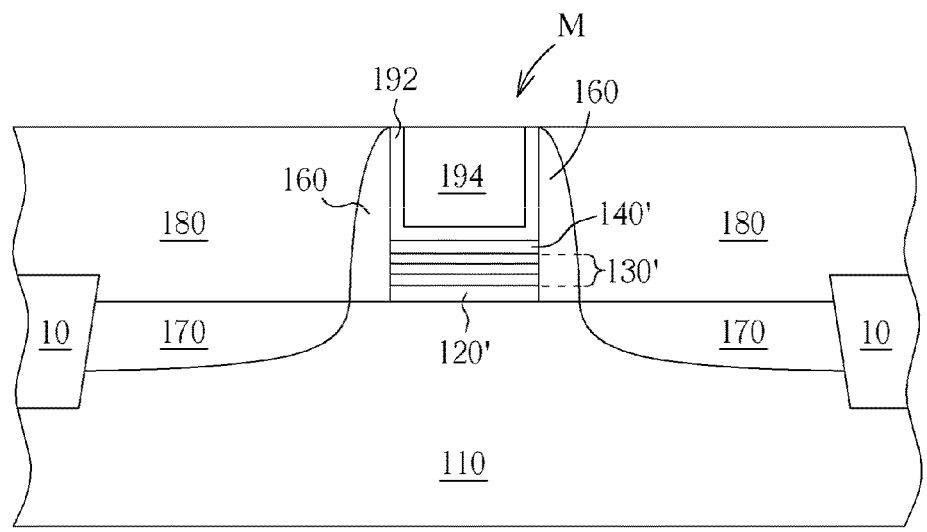

The patterned sacrificial electrode layer 150 is then removed by methods such as etching processes. As shown in FIG. 5, the patterned barrier layer 140' is exposed and a recess R is formed. As shown in FIG. 6, a work function metal layer (not shown) and a low resistivity material (not shown) are sequentially formed to cover the recess R and the interdielectric layer 180, and then the work function metal layer (not shown) and the low resistivity material (not shown) are patterned to form a work function metal layer 192 and a low resistivity material 194 in the recess R, which means that a metal gate M is now formed. The work function metal layer 192 include metals satisfying the work function requirements of formed transistors, wherein the work function metal layer 192 may be a single layer or a multilayer structure, composed of titanium nitride (TiN), titanium carbide (TiC), tantalum nitride (TaN), tantalum carbide (TaC), tungsten carbide (WC), titanium aluminide (TiAl) or aluminum titanium nitride (TiAlN) or etc. The low resistivity material 194 may be composed of low resistivity materials such as aluminum, tungsten, titanium aluminum (TiAl) alloy, cobalt tungsten phosphide (CoWP) or etc. A barrier layer (not shown) maybe selectively formed between the work function metal layer 192 and the low resistivity material 194.

A gate-last for high-K first process is performed in this embodiment. Therefore, the patterned buffer layer 120', the patterned stacked metal oxide layer 130' and the patterned barrier layer 140' all have a "—"-shaped cross sectional profile, and the work function metal layer 192 has an U-shaped cross sectional profile.

Figure 11:
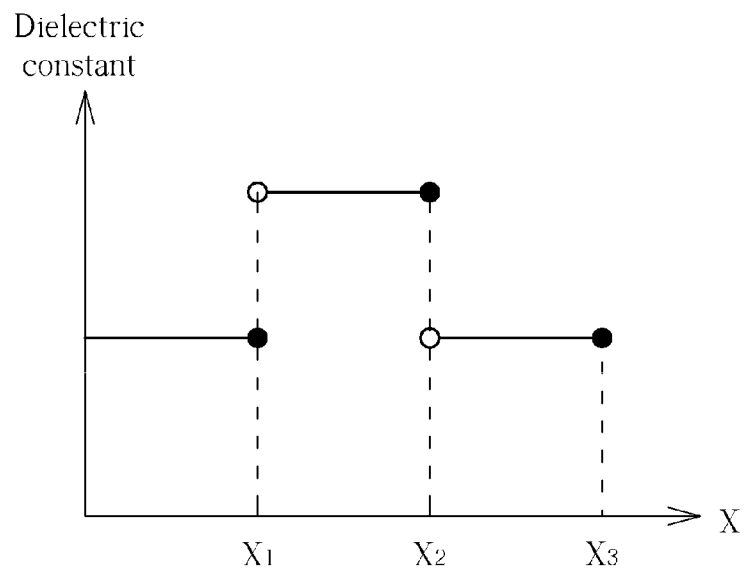
FIG. 11 schematically depicts a curve diagram of the dielectric constant of a metal oxide layer versus the distance from a substrate according to a first embodiment and a second embodiment of the present invention.
Figure 11:
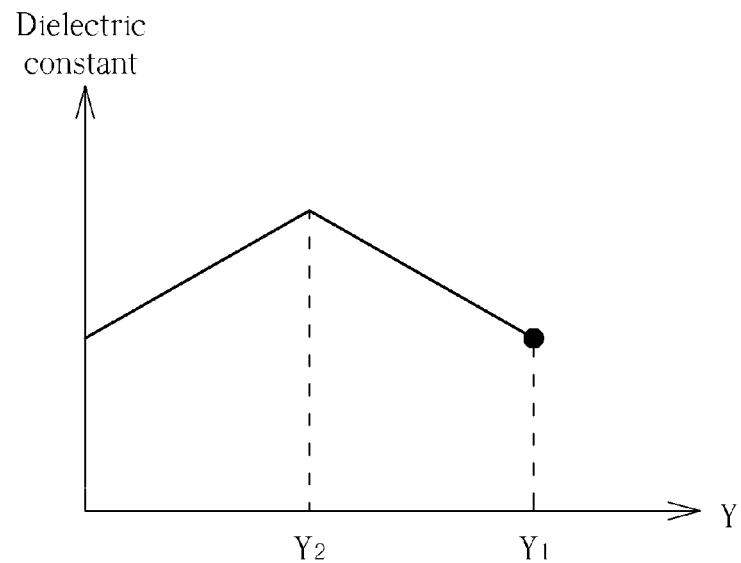

The stacked metal oxide layer 130 in the present invention includes the first metal oxide layer 132, the second metal oxide layer 134 and the third metal oxide layer 136 with different materials. Thus the curve of the energy bandgap of the stacked metal oxide layer 130 versus the distance X from the substrate 110 is a non-continuous curve. As shown in the left diagram of FIG. 11, depicts a curve diagram of the dielectric constant of a metal oxide layer 130 versus the distance from a substrate, and the dielectric constant is opposite to a corresponding bandgap. The thickness of the first metal oxide layer 132 is X1, the thickness of the second metal oxide layer 134 is X2-X1, and the thickness of the third metal oxide layer 136 is X3-X2. There are dielectric constant (energy bandgap) chasms at the boundary of the first metal oxide layer 132 and the second metal oxide layer 134 (at X1) and at the boundary of third metal oxide layer 136 and the second metal oxide layer 134 (at X2), so that the curve of the energy bandgap of the stacked metal oxide layer 130 versus the distance X from the substrate 110 is a non-continuous curve.

Due to the energy bandgap dramatically changing at the boundaries of each metal oxide layer 132, 134, 136, quantum wells are therefore generate in these places, and electrons or electrical holes are trapped. Thus, a metal oxide layer 230 having a continuous curve of the energy bandgap of the metal oxide layer 230 versus the distance from a substrate is presented in the following paragraphs.

Figure 7:
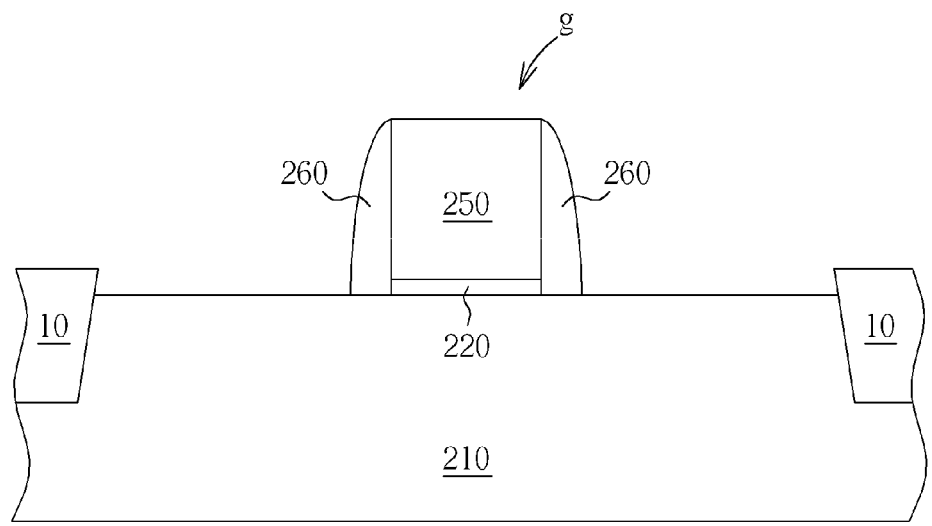
FIGS. 7-10 schematically depict cross-sectional views of a semiconductor process according to a second embodiment of the present invention.
Figure 8:
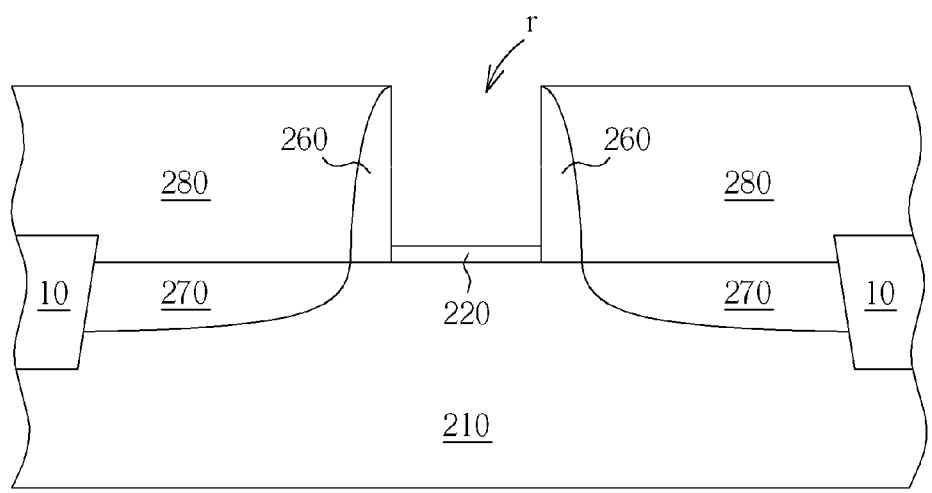

FIGS. 7-10 schematically depict cross-sectional views of a semiconductor process according to a second embodiment of the present invention. As shown in FIG. 7, an isolation structure 10 is formed in the substrate 210 to electrically isolate each transistor. A buffer layer (not shown) and a sacrificial electrode layer (not shown) are sequentially formed on the substrate 210, and then the sacrificial electrode layer (not shown) and the buffer layer (not shown) are patterned to form a patterned buffer layer 220 and a patterned sacrificial electrode layer 250 to form a gate structure g. A spacer 260 is formed on the substrate 110 beside the gate structure g. As shown in FIG. 8, an ion implantation process is performed to automatically align and form a source/drain region 270. An interdielectric layer (not shown) is formed to cover the gate structure g, the spacer 260 and the substrate 210, and then the interdielectric layer (not shown) is planarized to form an interdielectric layer 280. The patterned sacrificial electrode layer 250 is removed to expose the patterned buffer layer 220, and a recess r is formed. The patterned buffer layer 220 may be selectively removed to form a new buffer layer.

Figure 9:
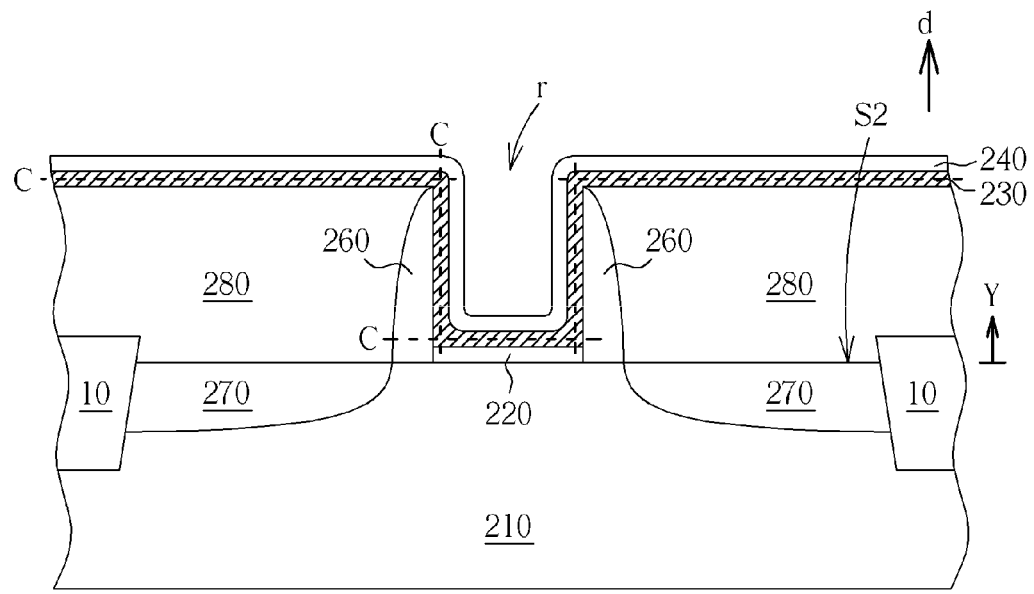

As shown in FIG. 9, a metal oxide layer 230 is formed to cover the recess r and the interdielectric layer 280. A barrier layer 240 maybe selectively formed to cover the metal oxide layer 230. In this embodiment, the metal oxide layer 230 is formed through an atomic layer deposition (ALD) process, which imports two or more precursors simultaneously to form the metal oxide layer 230, wherein the energy bandgap of the metal oxide layer 230 changes along a direction d perpendicular to the surface S2 of the substrate 210. For instance, the metal oxide layer 230 may be composed of $Hf_xZr_yO_2$, and the ratio of Hf, Zr, or O can be controlled by each imported precursors during the atomic layer deposition (ALD) process. In one case, precursors of Hafnium Tetrachloride (HfCl4), Zirconium Tetrachloride (ZrCl4) and water (H2O) may be imported simultaneously to form the $Hf_xZr_yO_2$ layer. The metal oxide layer 230 maybe the group selected from hafnium oxide (HfO2), hafnium silicon oxide (HfSiO4), hafnium silicon oxynitride (HfSiON), aluminum oxide (Al2O3), lanthanum oxide (La2O3), tantalum oxide (Ta2O5), yttrium oxide (Y2O3), zirconium oxide (ZrO2), strontium titanate oxide (SrTiO3), zirconium silicon oxide (ZrSiO4), hafnium zirconium oxide (HfZrO4), strontium bismuth tantalite (SrBi2Ta2O9, SBT), lead zirconate titanate (PbZrxTi1-xO3, PZT) and barium strontium titanate (BaxSr1-xTiO3, BST), and the ingredient distribution changes along a direction d perpendicular to the surface S2 of the substrate 210. For example, the metal oxide layer 230 may be composed of $Hf_xLa_yO_2$, $Hf_xTi_yO_2$ or etc. The barrier layer 240 may be composed of titanium, titanium nitride, tantalum, tantalum nitride or etc, to prevent metal atoms from diffusing.

By doing this, this embodiment not only has the benefits of the first embodiment, such as improving the reliability (like the time dependent dielectric breakdown (TDDB) for example) of later formed semiconductor components such as transistors, reducing the equivalent oxide thickness (EOT) and avoiding circuit leakage, but also have a continuous curve of the energy bandgap of the metal oxide layer 230 versus the distance from the substrate 210, due to the components of the metal oxide layer 230 that can be adjusted by each imported precursor. Therefore, the extreme change in the energy bandgaps of the first embodiment, leading to electrons or electrical holes to get trapped can be avoided.

More precisely, the lowest energy bandgap value of the metal oxide layer 230 is not at the two ends of the metal oxide layer 230, to avoid trapping charges at the boundary of the metal oxide layer 230 and the substrate 210 or the patterned buffer layer 220, or at the boundary of the metal oxide layer 230 and the barrier layer 240, which would cause circuit leakage. Specifically, the lowest energy bandgap value of the metal oxide layer 230 can be designed at a centerline C of the metal oxide layer 230, wherein the centerline C is parallel to the surface S2 of a material layer below the metal oxide layer 230 (the substrate 210, the spacer 260 and the interdielectric layer 280 for example),so the lowest energy bandgap of the metal oxide layer 230 can be as far from the substrate 210, the patterned buffer layer 220 and the barrier layer 240 as possible. As the metal oxide layer 230 is used as a gate dielectric layer of an NMOS transistor, the lowest energy bandgap value of the metal oxide layer 230 is preferred to be designed farther from the substrate 210 than the centerline C, so that the larger energy bandgap part of the metal oxide layer 230 would not contact or would not be too close to the substrate 210, leading the generation of partial low bandgap regions that would trap electrons at this place, which would cause circuit leakages into the substrate 210. In contrast, as the metal oxide layer 230 is used as a gate dielectric layer of a PMOS transistor, the lowest energy bandgap value of the metal oxide layer 230 is preferred to be designed closer to the substrate 210 than the centerline C, so that the larger energy bandgap parts of the metal oxide layer 230 would not contact or would not too close to metal materials such as the barrier layer 240 above the metal oxide layer 230, leading to the generation of partial low bandgap regions that would trap electrical holes at this place, which would cause circuit leakages into the metal materials, such as the barrier layer 240.

Figure 10:
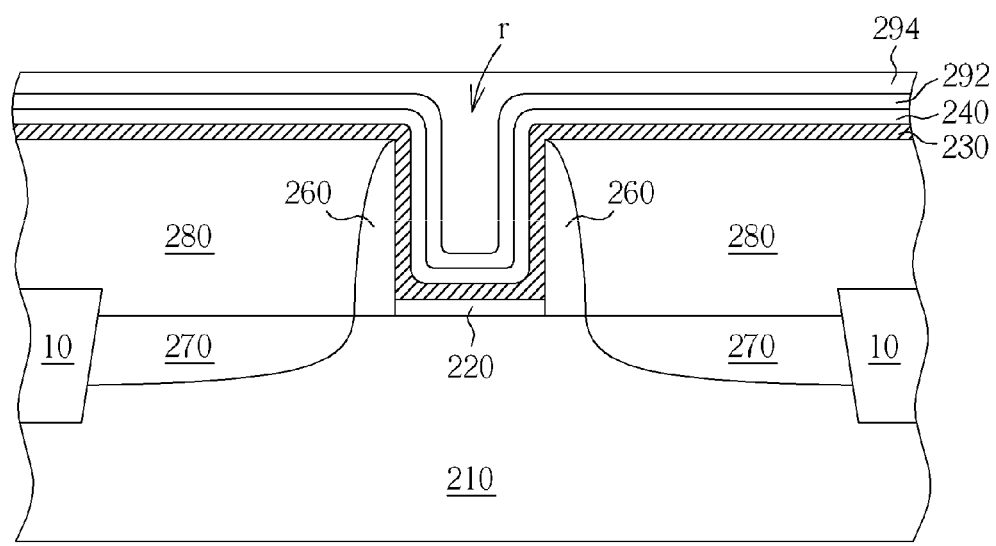

As shown in FIG. 10, a work function metal layer 292 and a low resistivity material 294 are sequentially formed to cover the recess R and the interdielectric layer 280, and then the work function metal layer 292 and the low resistivity material 294 are patterned to form a metal gate (not shown). Furthermore, a barrier layer may be selectively formed between the work function metal layer 292 and the low resistivity material 294.

A gate-last for high-K last buffer layer first process is performed in this embodiment, so that the patterned buffer layer 220 has a "—"-shaped cross-sectional profile, and the metal oxide layer 230, the barrier layer 240 and the work function metal layer 292 all have an U-shaped cross-sectional profile. The curve of the energy bandgap of the metal oxide layer 230 versus the distance Y from the substrate 210 is a continuous curve. As shown in the right diagram of FIG. 11, depicts a curve diagram of the dielectric constant of a metal oxide layer 230 versus the distance from a substrate, and the dielectric constant is opposite to a corresponding bandgap. The thickness of the metal oxide layer 230 is Y1, and the energy bandgap of the metal oxide layer 230 has a lowest value at the distance Y2 from the substrate 210.

Although a gate-last for high-K first process applied in the first embodiment is paired with the stacked metal oxide layer, it may also be paired with the gradient metal oxide layer of the second embodiment; although a gate-last for high-K last process applied in the second embodiment is paired with the gradient metal oxide layer, it may also be paired with the stacked metal oxide layer of the first embodiment To summarize, the present invention provides a semiconductor structure and a process thereof, which forms a metal oxide layer, and the energy bandgap of the metal oxide layer changes along a direction perpendicular to the surface of the substrate. More precisely, the metal oxide layer may be a stacked metal oxide layer, formed through an atomic layer deposition (ALD) process, sequentially importing different precursors; and the stacked metal oxide layer includes a first metal oxide layer, a second metal oxide layer and a third metal oxide layer from top to bottom, wherein the energy bandgap of the second metal oxide layer is higher than the energy bandgap of the first metal oxide layer and that of the third metal oxide layer. The metal oxide layer may be one metal oxide layer formed through an atomic layer deposition (ALD) process importing two or more precursors at the same time, so that the energy bandgap of the metal oxide layer can change along a direction perpendicular to the surface of the substrate. In this way, the reliability of semiconductor components formed by the metal oxide layer of the present invention is improved, the equivalent oxide thickness (EOT) of the metal oxide layer is reduced and circuit leakage is avoided.

More precisely, as the metal oxide layer is a stacked metal oxide layer, the thickness of the first metal oxide layer maybe equal to the thickness of the third metal oxide layer, so that the second metal oxide layer is located between the first metal oxide layer and the third metal oxide layer, and that the second metal oxide layer is not too close to the substrate nor to the barrier layer. In addition, as the stacked metal oxide layer is used as a gate dielectric layer of an NMOS transistor, the thickness of the first metal oxide layer is preferred to be designed thinner than the thickness of the third metal oxide layer, so as to have the second metal oxide layer far from the substrate, thereby avoiding circuit leakage into the substrate. When the stacked metal oxide layer is used as a gate dielectric layer of a PMOS transistor, the thickness of the first metal oxide layer is preferred to be designed larger than the thickness of the third metal oxide layer, so as to have the second metal oxide layer far from the barrier layer, thereby avoiding circuit leakage to the barrier layer.

As the metal oxide layer has a gradient energy bandgap, the lowest energy bandgap value of the metal oxide layer cannot be at the two ends of the metal oxide layer, so that circuit leakage into the components at the two ends of the metal oxide layer can be avoided. Preferably, the lowest energy bandgap value of the metal oxide layer can be designed to be at the centerline. In addition, as the metal oxide layer is used as a gate dielectric layer of an NMOS transistor, the lowest energy bandgap value of the metal oxide layer is preferred to be designed farther from the substrate than the centerline, thereby avoiding circuit leakage into the substrate. When the metal oxide layer is used as a gate dielectric layer of a PMOS transistor, the lowest energy bandgap value of the metal oxide layer is preferred to be designed closer to the substrate than the centerline, thereby avoiding circuit leakage into the barrier layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process, comprising:
performing an atomic layer deposition (ALD) process, that sequentially imports different precursors forming a first metal oxide layer, a second metal oxide layer and a third metal oxide layer on a substrate, forming this way a stacked metal oxide layer comprising the first metal oxide layer disposed above the third metal oxide layer, wherein the energy bandgap of the second metal oxide layer is higher than the energy bandgap of the first metal oxide layer and that of the third metal oxide layer, and the thickness of the first metal oxide layer is different from the thickness of the third metal oxide layer, wherein the thickness of the first metal oxide layer of the stacked metal oxide layer being a gate dielectric layer of an NMOS transistor is thinner than the thickness of the third metal oxide layer of the stacked metal oxide layer being the gate dielectric layer of the NMOS transistor, or the thickness of the first metal oxide layer of the stacked metal oxide layer being a gate dielectric layer of an PMOS transistor is larger than the thickness of the third metal oxide layer of the stacked metal oxide layer being the gate dielectric layer of the PMOS transistor.

2. The semiconductor process according to claim 1, wherein the first metal oxide layer and the third metal oxide layer are composed of the same materials.

3. The semiconductor process according to claim 1, wherein the first metal oxide layer and the third metal oxide layer are hafnium oxide layers, and the second metal oxide layer is a zirconium oxide layer.

4. A semiconductor process, comprising:
performing an atomic layer deposition (ALD) process, that imports two or more precursors simultaneously forming one single metal oxide layer on a substrate, wherein the energy bandgap of the single metal oxide layer changes along a direction perpendicular to the surface of the substrate, and the lowest energy bandgap value of the single metal oxide layer is neither at any one end of the metal oxide layer nor at a centerline of the metal oxide layer, wherein the lowest energy bandgap value of the single metal oxide layer is farther from the substrate than a centerline of the metal oxide layer formed by performing an atomic layer deposition (ALD) process, that imports two or more precursors simultaneously used as a gate dielectric layer of an NMOS transistor, or the lowest energy bandgap value of the metal oxide layer is closer to the substrate than a centerline of the metal oxide layer formed by performing an atomic layer deposition (ALD) process, that imports two or more precursors simultaneously used as a gate dielectric layer of a PMOS transistor, wherein the centerline of the single metal oxide layer is parallel to the surface of the substrate.

5. The semiconductor process according to claim 4, wherein the metal oxide layer comprises $Hf_xZr_yO_2$.

6. The semiconductor process according to claim 4, wherein the energy bandgap of the metal oxide layer is not constant, and the curve of the energy bandgap versus the distance from the substrate is a continuous curve.

7. The semiconductor process according to claim 4, wherein the energy bandgap of the metal oxide layer is not constant, and the curve of the energy bandgap versus the distance from the substrate is a non-continuous curve.

* * * * *